United States Patent
Hazelton

(10) Patent No.: US 6,809,323 B2
(45) Date of Patent: Oct. 26, 2004

(54) ISOLATED FRAME CASTER

(75) Inventor: Andrew J. Hazelton, San Carlos, CA (US)

(73) Assignee: Nikon Corporation, Tokyo (JP)

(*) Notice: Subject to any disclaimer, the term of this patent is extended or adjusted under 35 U.S.C. 154(b) by 0 days.

(21) Appl. No.: 10/116,428

(22) Filed: Apr. 3, 2002

(65) Prior Publication Data

US 2003/0189177 A1 Oct. 9, 2003

(51) Int. Cl.$^7$ .............................................. E21K 5/10
(52) U.S. Cl. ................................................ 250/442.11
(58) Field of Search .................... 250/442.11, 492.1, 250/492.2, 492.3, 492.22, 440.11; 355/53; 357/393, 391; 248/638, 651; 74/490.06, 490.09, 490.01; 108/137, 143

(56) References Cited

U.S. PATENT DOCUMENTS

| | | | | |
|---|---|---|---|---|
| 5,446,519 A | * | 8/1995 | Makinouchi | 355/53 |
| 5,528,118 A | * | 6/1996 | Lee | 318/568.17 |
| 5,874,820 A | * | 2/1999 | Lee | 355/53 |
| 6,252,234 B1 | | 6/2001 | Hazelton et al. | 250/442.11 |
| 6,686,991 B1 | * | 2/2004 | Binnard et al. | 355/72 |
| 6,717,653 B2 | * | 4/2004 | Iwamoto et al. | 355/72 |
| 6,724,000 B2 | * | 4/2004 | Hazelton | 250/442.11 |

FOREIGN PATENT DOCUMENTS

WO   00/14779   3/2000

* cited by examiner

Primary Examiner—Nikita Wells
Assistant Examiner—James P. Hughes
(74) Attorney, Agent, or Firm—Ritter, Lang & Kaplan LLP

(57) ABSTRACT

Methods and apparatus for reducing the transmission of vibrations within a caster system that supports a stage apparatus with a reaction frame are disclosed. According to one aspect of the present invention, a caster system that support portions of a stage apparatus which has a reaction frame and a stage assembly includes a first caster component and at least a second caster component. The first caster component supports the stage assembly, while the second caster component supports the reaction frame and is vibrationally separated from the first caster component. The second caster component may be physically coupled to the first caster component to enable the first caster component, the second caster component, the reaction frame, and the stage assembly to be moved as a substantially single unit.

28 Claims, 8 Drawing Sheets

ISOLATED FRAME CASTER

BACKGROUND OF THE INVENTION

1. Field of Invention

The present invention relates generally to semiconductor processing equipment. More particularly, the present invention relates to a caster which isolates a reaction frame from an active vibration isolation system on which a stage apparatus is situated, while still enabling the stage apparatus, the active vibration isolation system, and the reaction frame to be moved as a unit.

2. Description of the Related Art

For precision instruments such as photolithography machines which are used in semiconductor processing, factors which affect the performance, e.g., accuracy, of the precision instrument generally must be dealt with and, insofar as possible, eliminated. When the performance of a precision instrument is adversely affected, as for example by reaction forces or by vibrations, products formed using the precision instrument may be improperly formed and, hence, defective. For instance, a photolithography machine which is subjected to vibratory motion may cause an image projected by the photolithography machine to move, and, as a result, be aligned incorrectly on a projection surface such as a semiconductor wafer surface.

Scanning stages such as wafer scanning stages and reticle scanning stages are often used in semiconductor fabrication processes, and may be included in various photolithography and exposure apparatuses. Wafer scanning stages are generally used to position a semiconductor wafer such that portions of the wafer may be exposed as appropriate for masking or etching. Reticle scanning stages are generally used to accurately position a reticle or reticles for exposure over the semiconductor wafer. Patterns are generally resident on a reticle, which effectively serves as a mask or a negative for a wafer. When a reticle is positioned over a wafer as desired, a beam of light or a relatively broad beam of electrons may be collimated through a reduction lens, and provided to the reticle on which a thin metal pattern is placed. Portions of a light beam, for example, may be absorbed by the reticle while other portions pass through the reticle and are focused onto the wafer.

A stage such as a wafer scanning stage or a reticle scanning stage is typically supported by a base structure such that the stage may move in a linear direction. Planar or linear motors may be used to facilitate the movement of wafer scanning stages and reticle scanning stages within a photolithography apparatus or an exposure apparatus. A motor which moves or drives a stage is often mounted between the stage and the base structure. When a motor causes a stage to move, forces are typically created between moving and non-moving portions of the motor, and reaction forces are also generally created. That is, forces which accelerate the stage also act on the base structure substantially equally, and in the opposite direction. Such reaction forces may cause the base structure to move, and may also cause vibrations to be induced in the base structure. Movement of the base structure renders it more difficult to position the stage, as motion of the base structure causes the stage to move.

As will be appreciated by those skilled in the art, forces or vibrations generated within a photolithography apparatus or exposure apparatus may cause issues relating to photolithography and exposure operations. The accuracy associated with such operations may be compromised when forces and vibrations affect the positioning of wafers or reticles, for example. To reduce the effect of reaction forces and vibrations which may be induced by the reaction forces associated with moving a stage assembly, reaction frames are often used to substantially isolate the reaction forces and to direct the reaction forces away from the stage assembly, e.g., to a ground surface. In addition to using reaction frames, an active vibration isolation system (AVIS) may be used to reduce the effect of vibrations within the overall photolithography apparatus. Often, reaction frames and base structures may be mounted on a caster which facilitates positioning of an overall apparatus that includes the reaction frames and the base structures.

FIGS. 1a and 1b are diagrammatic representations of an apparatus which includes a caster. An apparatus 102 includes a stage assembly 106, which may include components that are sensitive to vibrations, that is supported on an AVIS 110. Stage assembly 106 is coupled to a reaction frame 114 which is arranged to absorb reaction forces associated with moving a stage included in stage assembly 106. Both AVIS 110 and reaction frame 114 are supported on a caster 118. Caster 118, which may be positioned on legs 122, is generally used to enable apparatus 102, or a machine, to be readily moved between different locations. In other words, apparatus 102 may be moved as a substantially cohesive unit using caster 118, as AVIS 110 and reaction frame 114 are both mounted on caster 118.

Although caster 118 is often formed from a material such as polymer concrete which is typically effective to absorb vibrations and reaction forces associated with reaction frame 114, some vibrations modes may be transmitted from reaction frame 114 to AVIS 110 through caster 118. In addition, some vibrations or forces associated with reaction frame 114 may cause movement of caster 118. Any movement of caster 118 may give rise to performance issues in stage assembly 106. As such, photolithography or exposure processes associated with apparatus 102 may be compromised.

Therefore, what is needed is a caster which enables an apparatus positioned thereon to be moved as a unit, while reducing the transmissions of reaction forces or vibrations through the caster. That is, what is desired is an isolated caster system which enables an apparatus positioned thereon to be moved as a unit, while allowing reaction forces and vibrations to be isolated and prevented from affecting vibration-sensitive portions of the apparatus.

SUMMARY OF THE INVENTION

The present invention relates to reducing the coupling of vibrations within a caster system which facilitates overall positioning of an apparatus supported on the caster system. According to one aspect of the present invention, a caster system that supports portions of a stage apparatus, which has a reaction frame and a stage assembly, includes a first caster component and at least a second caster component. The first caster component supports the stage assembly, while the second caster component supports the reaction frame and is vibrationally separated from the first caster component. The second caster component may be physically coupled to the first caster component to enable the first caster component, the second caster component, the reaction frame, and the stage assembly to be moved as a substantially single unit. In one embodiment, the first and second caster components are arranged to be physically separated when the stage apparatus is not being moved.

A caster system which includes an isolated frame caster enables vibrations which may be induced within a reaction frame to be passed to the isolated frame caster, while substantially not affecting the portion of the caster system that supports an active vibration isolation system. Enabling vibrations to be isolated prevents a stage assembly supported on the active vibration isolation system from being affected by vibrations or movement caused by the vibrations. Further, allowing the isolated frame caster to be physically coupled to other portions of the isolated frame caster when the reaction frame and the active vibration isolation system is moved facilitates the movement of the reaction frame and the active vibration isolation system.

According to another aspect of the present invention, a caster system that facilitates movement of a substantially attached stage apparatus which has a stage assembly and a reaction frame includes a first component to which the stage assembly is coupled and a second component to which the reaction frame is coupled. The second component is vibrationally isolated from the first component to prevent at least one vibrational mode associated with the reaction frame from causing an affect in the first component. The first component and the second component are further arranged to be physically coupleable to facilitate the movement of the stage apparatus.

In one embodiment, the second component and the first component are arranged to be physically coupled using at least one bracket mechanism to enable the first component, the second component, the reaction frame, and the stage assembly to be moved as a substantially single unit. In another embodiment, the second component and the first component are arranged to be physically coupled using a first material to enable the first component, the second component, the reaction frame, and the stage assembly to be moved as a substantially single unit. In such an embodiment, the first material may be a soft rubber material.

According to another aspect of the present invention, an apparatus includes a stage assembly, a reaction frame, and a caster system. The stage assembly includes a table, and a motor that is arranged to cause the table to move and generates a reaction force when the table moves. The reaction frame is coupled to the stage assembly, and the reaction force is arranged to be transmitted from the motor to the reaction frame. The caster system includes a first caster component that is arranged to support the stage assembly and a second caster component that is arranged to support the reaction frame. The caster system facilitates the stage assembly and the reaction frame as a substantially single unit. The second caster component is arranged to be physically coupled to the first caster component and vibrationally isolated from the first caster component.

These and other advantages of the present invention will become apparent upon reading the following detailed descriptions and studying the various figures of the drawings.

BRIEF DESCRIPTION OF THE DRAWINGS

The invention may best be understood by reference to the following description taken in conjunction with the accompanying drawings in which.

DETAILED DESCRIPTION OF THE EMBODIMENTS

While a caster enables an apparatus such as a photolithography apparatus or an exposure apparatus that is supported on the caster to be relatively easily moved, i.e., from one location to another, a conventional caster may cause vibrations to be transmitted through the caster to vibration-sensitive portions of the apparatus. Further, any movement in the caster that arises due to a reaction force transmitted through a reaction frame may cause the apparatus to operate inaccurately, thereby potentially compromising the quality of products formed using the apparatus.

By providing an isolated caster system in which a reaction frame of an apparatus is supported on separate frame casters that are isolated from a caster that supports other portions of an apparatus, reaction forces and vibrations may be transmitted from the reaction frame through the frame caster to ground, thereby substantially preventing other portions of the apparatus from being exposed to the reaction forces or vibrations. In one embodiment, the components of the isolated caster system may be coupled together to form a single unit when the apparatus supported on the caster system is to be moved using the caster system. That is, the frame casters that support the reaction frame may be physically coupled to the caster that supports other portions of the apparatus to facilitate moving the apparatus as well as the caster system. Once the apparatus is in a desired position, then the frame casters that support the reaction frame may be separated from the caster that supports the other portions of the apparatus in order to once again isolate the frame casters.

Figure 1A:
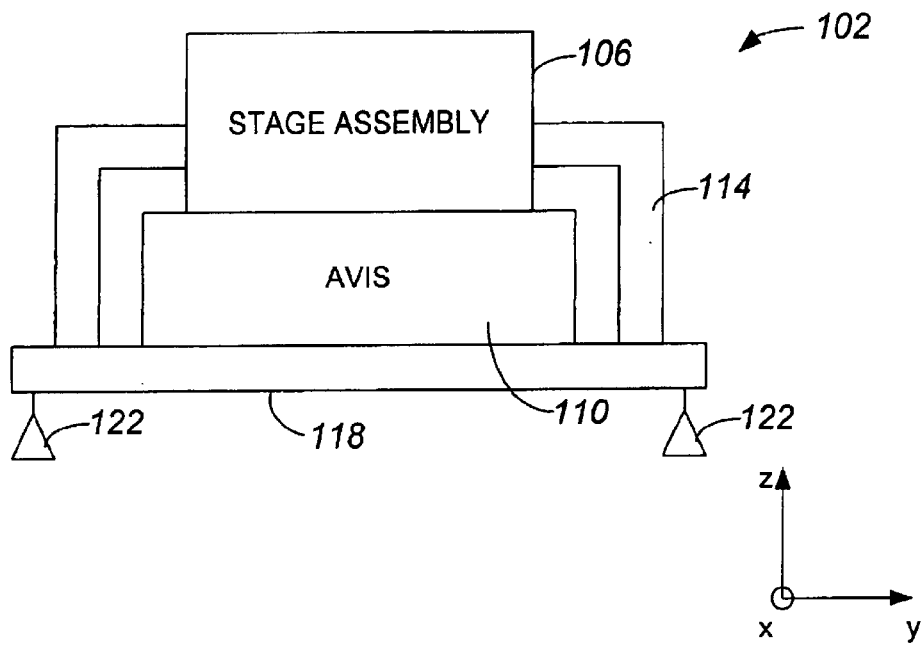
FIG. 1a is a diagrammatic block diagram representation of a first view of an apparatus which includes a stage assembly and a caster.
Figure 1B:
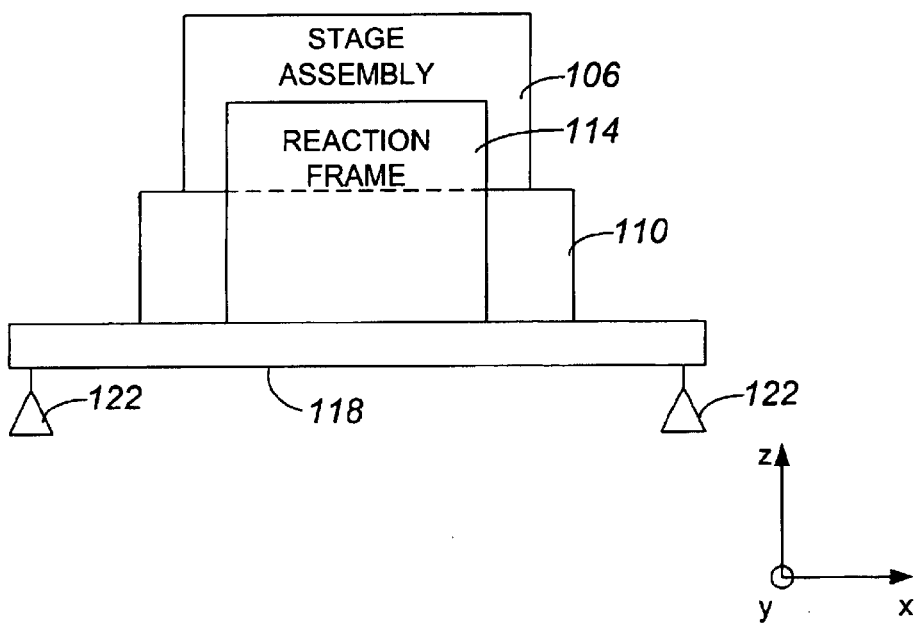
FIG. 1b is a diagrammatic block diagram representation of a second view of an apparatus, i.e., apparatus 102 of FIG. 1a, which includes a stage assembly and a caster.
Figure 2:
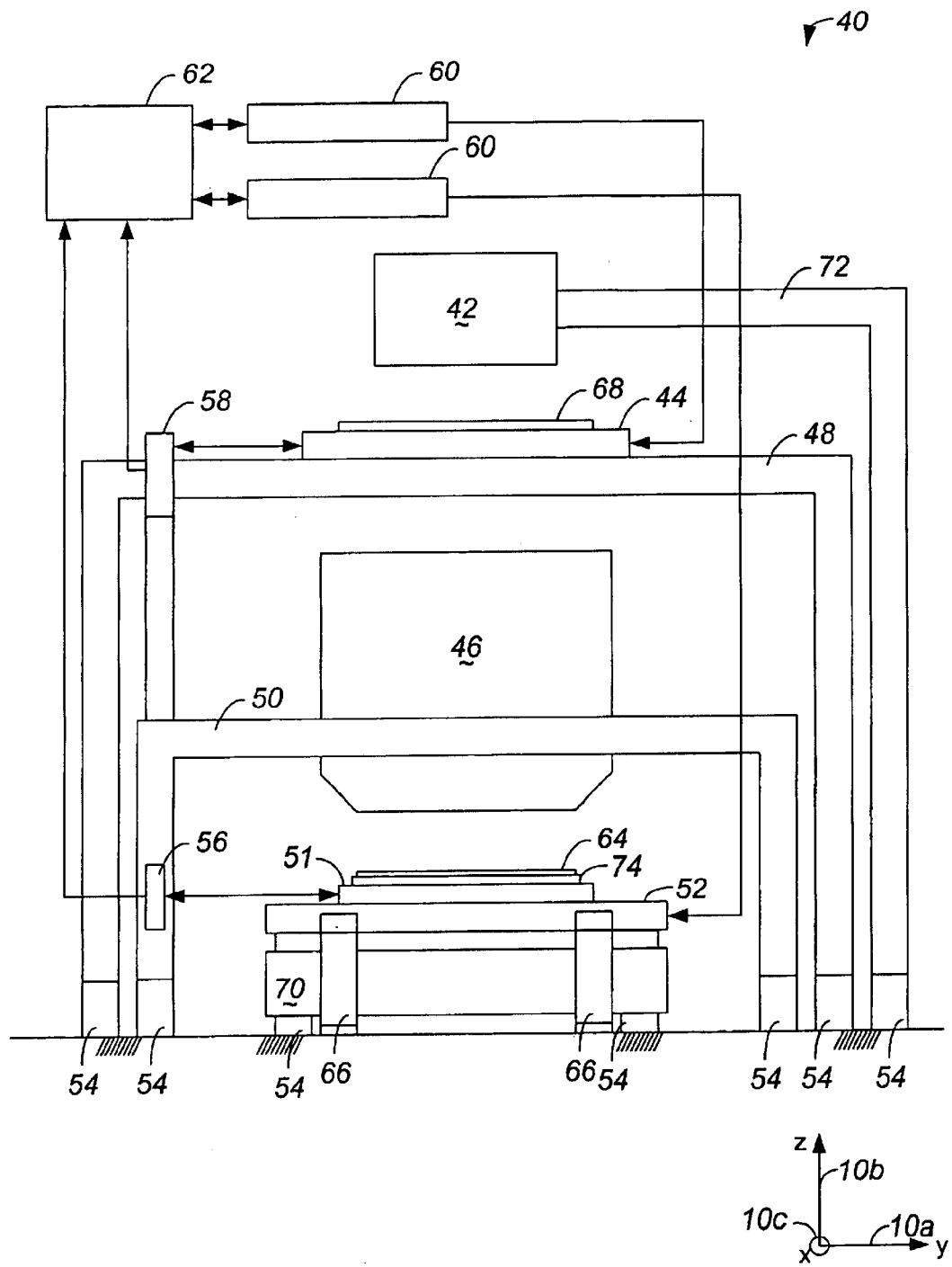
FIG. 2 is a diagrammatic representation of a photolithography apparatus in accordance with an embodiment of the present invention.

Substantially any suitable apparatus which includes a reaction frame or reaction frames may be positioned atop an isolated caster system. With reference to FIG. 2, a photolithography apparatus which includes a reaction frame, and may use an isolated caster system, will be described in accordance with an embodiment of the present invention. A photolithography apparatus (exposure apparatus) 40 includes a wafer positioning stage 52 that may be driven by a planar motor (not shown), as well as a wafer table 51 that is magnetically coupled to wafer positioning stage 52 by utilizing an EI-core actuator. The planar motor which drives wafer positioning stage 52 generally uses an electromagnetic force generated by magnets and corresponding armature coils arranged in two dimensions. A wafer 64 is held in place on a wafer holder 74 which is coupled to wafer table 51. Wafer positioning stage 52 is arranged to move in multiple degrees of freedom, e.g., between three to six degrees of freedom, under the control of a control unit 60 and a system controller 62. The movement of wafer positioning stage 52 allows wafer 64 to be positioned at a desired position and orientation relative to a projection optical system 46.

Wafer table 51 may be levitated in a z-direction 10b by any number of voice coil motors (not shown), e.g., three voice coil motors. In the described embodiment, at least three magnetic bearings (not shown) couple and move wafer table 51 along a y-axis 10a. The motor array of wafer positioning stage 52 is typically supported by a base 70. Base 70 is supported to a ground via isolators 54. Reaction forces generated by motion of wafer stage 52 may be mechanically released to a ground surface through a frame 66. As described above, reaction forces may be released to the floor or ground through a VCM or voice coil motor (not shown) that is substantially in contact with reaction frame 66. One suitable frame 66 is described in JP Hei 8-166475 and U.S. Pat. No. 5,528,118, which are each herein incorporated by reference in their entireties.

An illumination system 42 is supported by a frame 72. Frame 72 is supported to the ground via isolators 54. Illumination system 42 includes an illumination source, and is arranged to project a radiant energy, e.g., light, through a mask pattern on a reticle 68 that is supported by and scanned using a reticle stage which includes a coarse stage and a fine stage. The radiant energy is focused through projection optical system 46, which is supported on a projection optics frame 50 and may be supported the ground through isolators 54. Suitable isolators 54 include those described in JP Hei 8-330224 and U.S. Pat. No. 5,874,820, which are each incorporated herein by reference in their entireties.

A first interferometer 56 is supported on projection optics frame 50, and functions to detect the position of wafer table 51. Interferometer 56 outputs information on the position of wafer table 51 to system controller 62. In one embodiment, wafer table 51 has a force damper which reduces vibrations associated with wafer table 51 such that interferometer 56 may accurately detect the position of wafer table 51. A second interferometer 58 is supported on projection optical system 46, and detects the position of reticle stage 44 which supports a reticle 68. Interferometer 58 also outputs position information to system controller 62.

It should be appreciated that there are a number of different types of photolithographic apparatuses or devices. For example, photolithography apparatus 40, or an exposure apparatus, may be used as a scanning type photolithography system which exposes the pattern from reticle 68 onto wafer 64 with reticle 68 and wafer 64 moving substantially synchronously. In a scanning type lithographic device, reticle 68 is moved perpendicularly with respect to an optical axis of a lens assembly (projection optical system 46) or illumination system 42 by reticle stage 44. Wafer 64 is moved perpendicularly to the optical axis of projection optical system 46 by a wafer stage 52. Scanning of reticle 68 and wafer 64 generally occurs while reticle 68 and wafer 64 are moving substantially synchronously.

Alternatively, photolithography apparatus or exposure apparatus 40 may be a step-and-repeat type photolithography system that exposes reticle 68 while reticle 68 and wafer 64 are stationary. In one step and repeat process, wafer 64 is in a substantially constant position relative to reticle 68 and projection optical system 46 during the exposure of an individual field. Subsequently, between consecutive exposure steps, wafer 64 is consecutively moved by wafer positioning stage 52 perpendicularly to the optical axis of projection optical system 46 and reticle 68 for exposure. Following this process, the images on reticle 68 may be sequentially exposed onto the fields of wafer 64 so that the next field of semiconductor wafer 64 is brought into position relative to illumination system 42, reticle 68, and projection optical system 46.

It should be understood that the use of photolithography apparatus or exposure apparatus 40, as described above, is not limited to being used in a photolithography system for semiconductor manufacturing. For example, photolithography apparatus 40 may be used as a part of a liquid crystal display (LCD) photolithography system that exposes an LCD device pattern onto a rectangular glass plate or a photolithography system for manufacturing a thin film magnetic head. Further, an isolated caster system may also be applied to a proximity photolithography system that exposes a mask pattern by closely locating a mask and a substrate without the use of a lens assembly. Additionally, an isolated caster system may be used in other devices including, but not limited to, other semiconductor processing equipment, machine tools, metal cutting machines, and inspection machines.

The illumination source of illumination system 42 may be g-line (436 nanometers (nm)), i-line (365 nm), a KrF excimer laser (248 nm), a ArF excimer laser (193 nm), and an $F_2$-type laser (157 nm). Alternatively, illumination system 42 may also use charged particle beams such as x-ray and electron beams. For instance, in the case where an electron beam is used, thermionic emission type lanthanum hexaboride ($LaB_6$) or tantalum (Ta) may be used as an electron gun. Furthermore, in the case where an electron beam is used, the structure may be such that either a mask is used or a pattern may be directly formed on a substrate without the use of a mask.

With respect to projection optical system 46, when far ultra-violet rays such as an excimer laser is used, glass materials such as quartz and fluorite that transmit far ultra-violet rays is preferably used. When either an $F_2$-type laser or an x-ray is used, projection optical system 46 may be either catadioptric or refractive (a reticle may be of a corresponding reflective type), and when an electron beam is used, electron optics may comprise electron lenses and deflectors. As will be appreciated by those skilled in the art, the optical path for the electron beams is generally in a vacuum.

In addition, with an exposure device that employs vacuum ultra-violet (VUV) radiation of a wavelength that is approximately 200 nm or lower, use of a catadioptric type optical system may be considered. Examples of a catadioptric type of optical system include, but are not limited to, those described in Japan Patent Application Disclosure No. 8-171054 published in the Official gazette for Laid-Open Patent Applications and its counterpart U.S. Pat. No. 5,668,672, as well as in Japan Patent Application Disclosure No. 10-20195 and its counterpart U.S. Pat. No. 5,835,275, which are all incorporated herein by reference in their entireties. In these examples, the reflecting optical device may be a catadioptric optical system incorporating a beam splitter and a concave mirror. Japan Patent Application Disclosure (Hei) No. 8-334695 published in the Official gazette for Laid- Open Patent Applications and its counterpart U.S. Pat. No. 5,689,377, as well as Japan Patent Application Disclosure No. 10-3039 and its counterpart U.S. Pat. No. 5,892,117, which are all incorporated herein by reference in their entireties. These examples describe a reflecting-refracting type of optical system that incorporates a concave mirror, but without a beam splitter, and may also be suitable for use with the present invention.

Further, in photolithography systems, when linear motors (see U.S. Pat. Nos. 5,623,853 or 5,528,118, which are each incorporated herein by reference in their entireties) are used in a wafer stage or a reticle stage, the linear motors may be either an air levitation type that employs air bearings or a magnetic levitation type that uses Lorentz forces or reactance forces. Additionally, the stage may also move along a guide, or may be a guideless type stage which uses no guide.

Alternatively, a wafer stage or a reticle stage may be driven by a planar motor which drives a stage through the use of electromagnetic forces generated by a magnet unit that has magnets arranged in two dimensions and an armature coil unit that has coil in facing positions in two dimensions. With this type of drive system, one of the magnet unit or the armature coil unit is connected to the stage, while the other is mounted on the moving plane side of the stage.

Movement of the stages as described above generates reaction forces which may affect performance of an overall photolithography system. Reaction forces generated by the wafer (substrate) stage motion may be mechanically released to the floor or ground by use of a frame member as described above, as well as in U.S. Pat. No. 5,528,118 and published Japanese Patent Application Disclosure No. 8-166475. Additionally, reaction forces generated by the reticle (mask) stage motion may be mechanically released to the floor (ground) by use of a frame member as described in U.S. Pat. No. 5,874,820 and published Japanese Patent Application Disclosure No. 8-330224, which are each incorporated herein by reference in their entireties.

Isolaters such as isolators 54 may generally be associated with an active vibration isolation system (AVIS). An AVIS generally controls vibrations associated with forces 112, i.e., vibrational forces, which are experienced by a stage assembly or, more generally, by a photolithography machine such as photolithography apparatus 40 which includes a stage assembly. As such, allowing isolators and a reaction frame, e.g., isolators 54 and frame 66, to be substantially connected or coupled to the same base (not shown) may cause some vibration modes associated with the reaction frame to be transmitted through the isolators when the photolithography apparatus is in use. The base to which isolators and a reaction frame are coupled may be a caster which enables the overall photolithography apparatus to be more readily transported. That is, the overall photolithography apparatus may be transported or otherwise moved as a substantially single apparatus through the use of the caster, as opposed to being moved as separate components.

An isolated caster system which includes substantially separate casters for a reaction frame and for an AVIS generally prevents vibrations associated with the reaction frame from being transmitted to the AVIS when the caster system is in position, i.e., when the caster system is positioned on a ground surface. For transport purposes, the separate casters in the caster system may be coupled together when the overall apparatus supported on the caster system is to be moved. Removably coupling the separate casters together when the apparatus supported on the caster system is being moved, then substantially decoupling the separate casters when the apparatus is in a desired position allows for relatively easy transport of the apparatus, while reducing the transmission of vibrations from a reaction frame to an AVIS through the caster system.

Figure 3A:
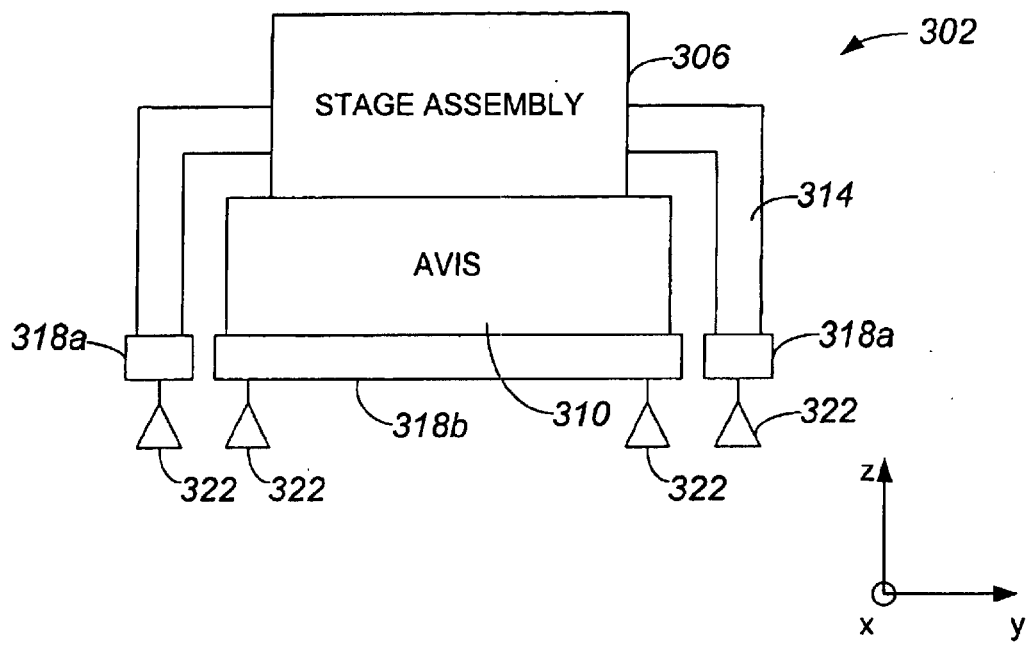
FIG. 3a is a diagrammatic block diagram representation of a first view of an apparatus which is positioned on an isolated caster system in accordance with an embodiment of the present invention.
Figure 3B:
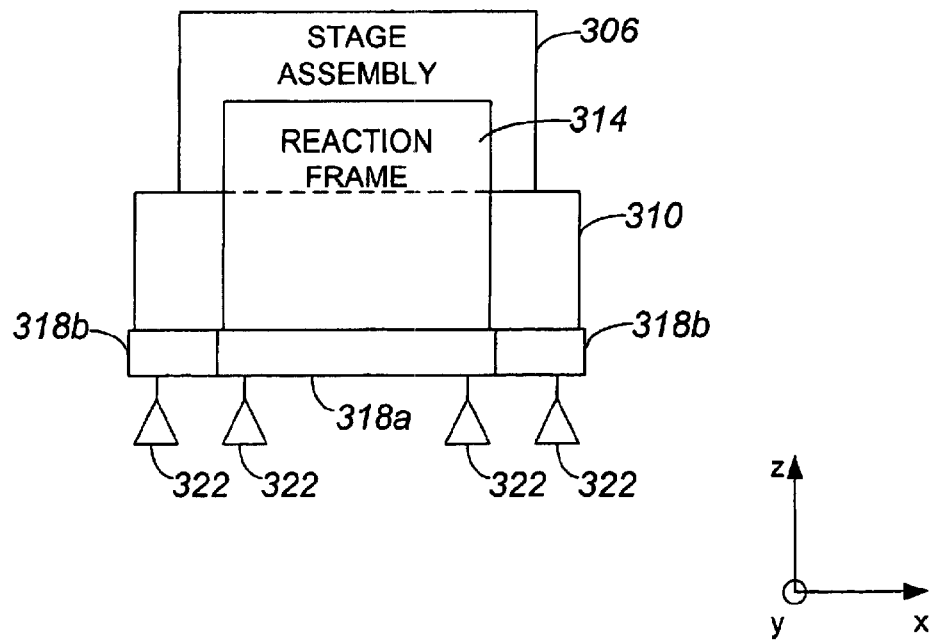
FIG. 3b is a diagrammatic block diagram representation of a second view of an apparatus, i.e., apparatus 302 of FIG. 3a, which is positioned on an isolated caster system in accordance with an embodiment of the present invention.

FIGS. 3a and 3b are diagrammatic block diagram representations of an apparatus which is positioned on an isolated caster system in accordance with an embodiment of the present invention. An apparatus 302 includes a stage assembly 306 which may include, but is not limited to, a wafer positioning stage and a motor which drives the wafer positioning stage. Stage assembly 306 is supported on an AVIS 310 to substantially minimize vibrations experienced within stage assembly 306. Stage assembly 306 may also generally include an illumination system and a projection optical system. More generally, stage assembly 306 may include substantially all components associated with photolithography apparatus 40 of FIG. 2, e.g., components which are sensitive to vibrations, with the exception of a reaction frame.

A reaction frame 314 is generally coupled to an actuator which enables a wafer scanning stage within stage assembly 306 to move. Reaction frame 314 is arranged to absorb reaction forces generated when the actuator which may be, for example, a linear motor or a VCM, causes the wafer scanning stage to accelerate or, more generally, move. Reaction frame 314 is further arranged to transmit reaction forces to a ground surface (not shown).

As shown, reaction frame 314 and AVIS 310 are mounted on a caster system 318. Caster system 318 is arranged such that reaction frame 314 is coupled to isolated frame casters 318a, while AVIS 310 is coupled to caster 318b. Frame casters 318a and caster 318b are formed as separate pieces, e.g., separate pieces of granite or a polymer material, such that any vibrations induced within reaction frame 314 by reaction forces are substantially prevented from being transmitted to AVIS 310. Specifically, vibration modes associated with reaction frame 314 maybe transmitted to frame casters 318a, and prevented from being transmitted through frame casters 318a into caster 318b and AVIS 310. Vibrations are prevented from being transmitted through frame casters 318a into caster 318b due to the fact that frame casters 318a are vibrationally and, in one embodiment, physically, separated or isolated from caster 318b. In other words, caster system 318 is vibrationally decoupled such that vibrations associated with frame casters 318a effectively do not cause vibrations within or movement of caster 318b.

Forming frame casters 318a and caster 318b as separate pieces within caster system 318 prevents any movement of frame casters 318a that is caused by reaction forces transmitted through reaction frame 314 from affecting AVIS 310 and stage assembly 306. That is, since some reactions forces and even some vibrational modes within reaction frame 314 may result in some movement of frame casters 318a, having frame casters 318a separate from caster 318b may prevent caster 318b, as well as AVIS 310 and stage assembly 306, from responding to the movement of frame casters 318a.

Legs 322 may support caster system 318 on a ground surface (not shown) when apparatus 302 is positioned in a desired location. In one embodiment, legs 322 may be adjustable such that a height associated with each leg 322 may be substantially independently varied as needed. Adjusting the height of each leg 322 enables caster system 318 to be positioned levelly, i.e., positioned such that caster system 318 is not at an angle, even when the ground surface (not shown) is relatively uneven. It should be appreciated, however, that legs 322 may not necessarily be adjustable and, further, are optional components of apparatus 302.

Figure 4:
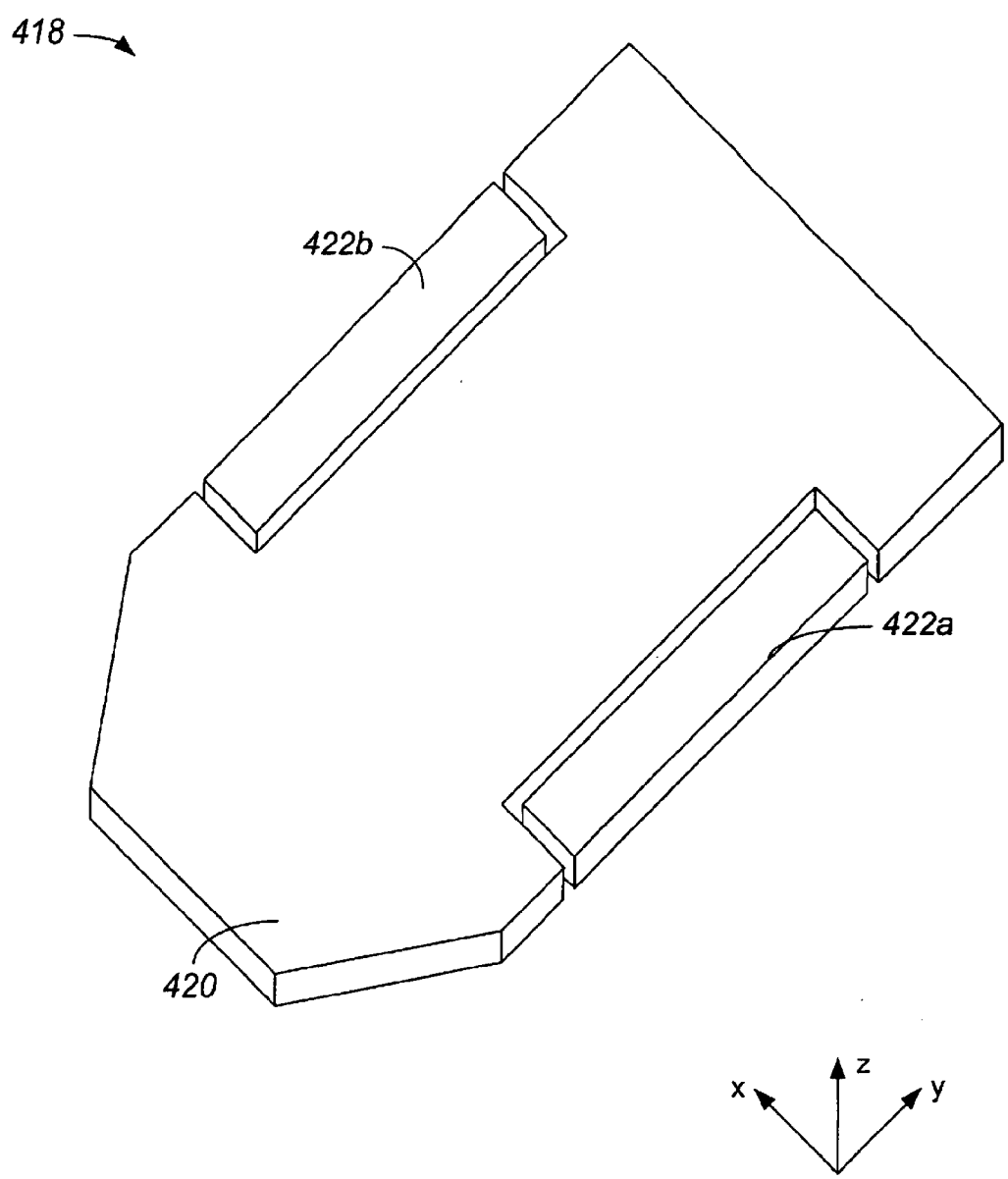
FIG. 4 is a diagrammatic representation of one caster system which includes isolated frame casters in accordance with an embodiment of the present invention.

In general, the shape and the size of caster system 318 may vary depending upon the requirements of a particular apparatus 302. FIG. 4 is a diagrammatic representation of one caster system which includes isolated frame casters in accordance with an embodiment of the present invention. A caster system 418 includes a section 420, or caster, which is arranged to support an AVIS and sections 422, or frame casters, which are arranged to support a reaction frame or frames. AVIS support section 420 and reaction frame support sections 422 are effectively separate casters.

AVIS support section 420 may include openings or other devices (not shown) which are arranged to enable an AVIS to be substantially attached to AVIS support section 422. Likewise, reaction frame support sections 422 may also include openings or other devices (not shown) which enable a reaction frame or reaction frames to be attached to reaction frame support sections 422. As shown, reaction frame support sections 422 are separate pieces, although reaction frame support section 422a and reaction frame support section 422b may be formed as a single piece, e.g., a piece which is positioned around the perimeter of AVIS support section 420.

Figure 5A:
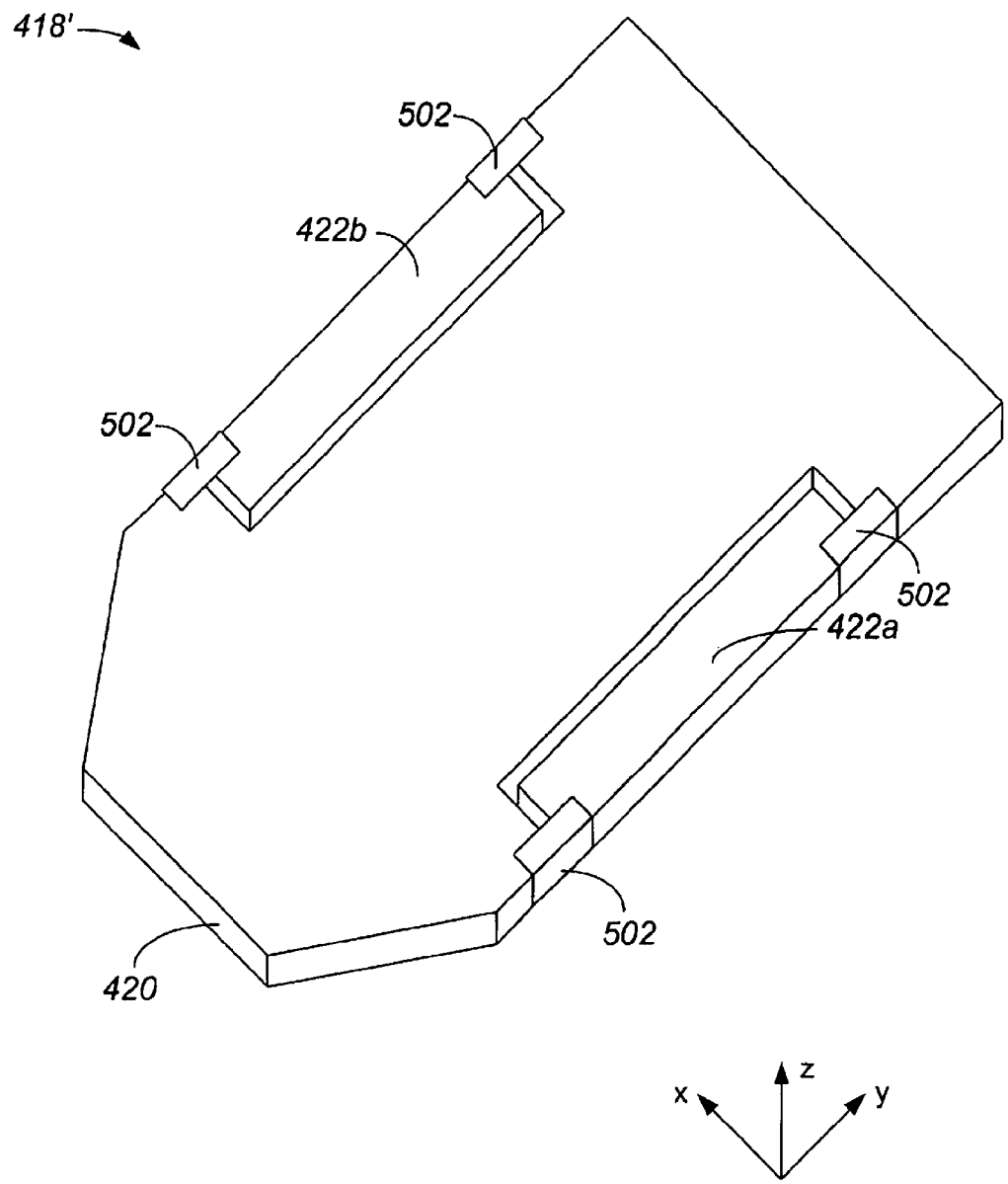
FIG. 5a is a diagrammatic representation of a caster system, i.e., caster system 418 of FIG. 4, which includes brackets in accordance with an embodiment of the present invention.

To facilitate the portability of an apparatus such as a photolithography or exposure apparatus using caster system 418, AVIS support section 420 and reaction frame support sections 422 may be arranged to be coupled together such that caster system 418 is effectively a single piece. That is, since moving an apparatus positioned on caster system 418 may be difficult when AVIS support section 420 and reaction frame support sections 422 are separate, AVIS support section 420 and reaction frame support sections 422 may be held together when the apparatus is positioned on caster system 418. In one embodiment, AVIS support section 420 and reaction frame support sections 422 may be temporarily held together using brackets. FIG. 5a is a diagrammatic representation of a caster system, i.e., caster system 418 of FIG. 4, which includes brackets in accordance with an embodiment of the present invention. Caster system 418' includes AVIS support section 420 and reaction frame support sections 422, which are coupled using brackets 502. Specifically, brackets 502 may be placed substantially over and around parts of AVIS support section 420 and reaction frame support sections 422, as shown, to secure reaction frame support sections 422 against AVIS support section 420. In one embodiment, brackets 502 may be secured to AVIS support section 420 and reaction frame support sections 422 using fastening mechanisms, e.g., screws, which allow brackets 502 to be relatively easily attached and detached.

With brackets 502 in place, caster system 418' is effectively a single caster and, hence, may be moved as a single piece. As such, difficulties associated with moving the apparatus supported on caster system 418' when caster system 418' is not a single caster may be substantially avoided. Further, considerations associated with aligning AVIS support section 420 and reaction frame support sections 422 relative to one another once the apparatus is positioned in a desired location may effectively be avoided.

To isolate reaction frame support sections 422 from AVIS support section 420 once caster system 418' is in place, i.e., once the apparatus supported on caster system 418' is in a desired location, brackets 502 may be removed. Removing brackets 502 essentially physically decouples reaction frame support sections 422 from AVIS support section 420 to substantially isolate reaction frame support sections 422. Therefore, forces or vibrations associated with reaction frame support sections 422 may be isolated from AVIS support section 420, an AVIS supported on AVIS support section 420, and components mounted on the AVIS.

In lieu of using brackets 502 or other similar mechanisms to couple reaction frame support sections 422 to AVIS support section 420, a "filler" material or a material which does not transmit significant forces or vibrations therethrough may be used for coupling purposes. Such a filler material, e.g., a material such as soft rubber or another relatively weak material, may be bound to sides of reaction frame support sections 422 and AVIS support section 420 to effectively fill in spaces between reaction frame support sections 422 and AVIS support section 420. Since the filler material is a relatively weak material that does not transmit significant forces or vibrations, the use of the filler material would enable a caster system to be moved as a single piece, while allowing the caster system to isolate reaction forces or vibrations associated with respect to portions of the caster system on which a reaction frame is mounted, e.g., reaction frame support sections 422. In one embodiment, the filler material preferably has a relatively high damping.

Figure 5B:
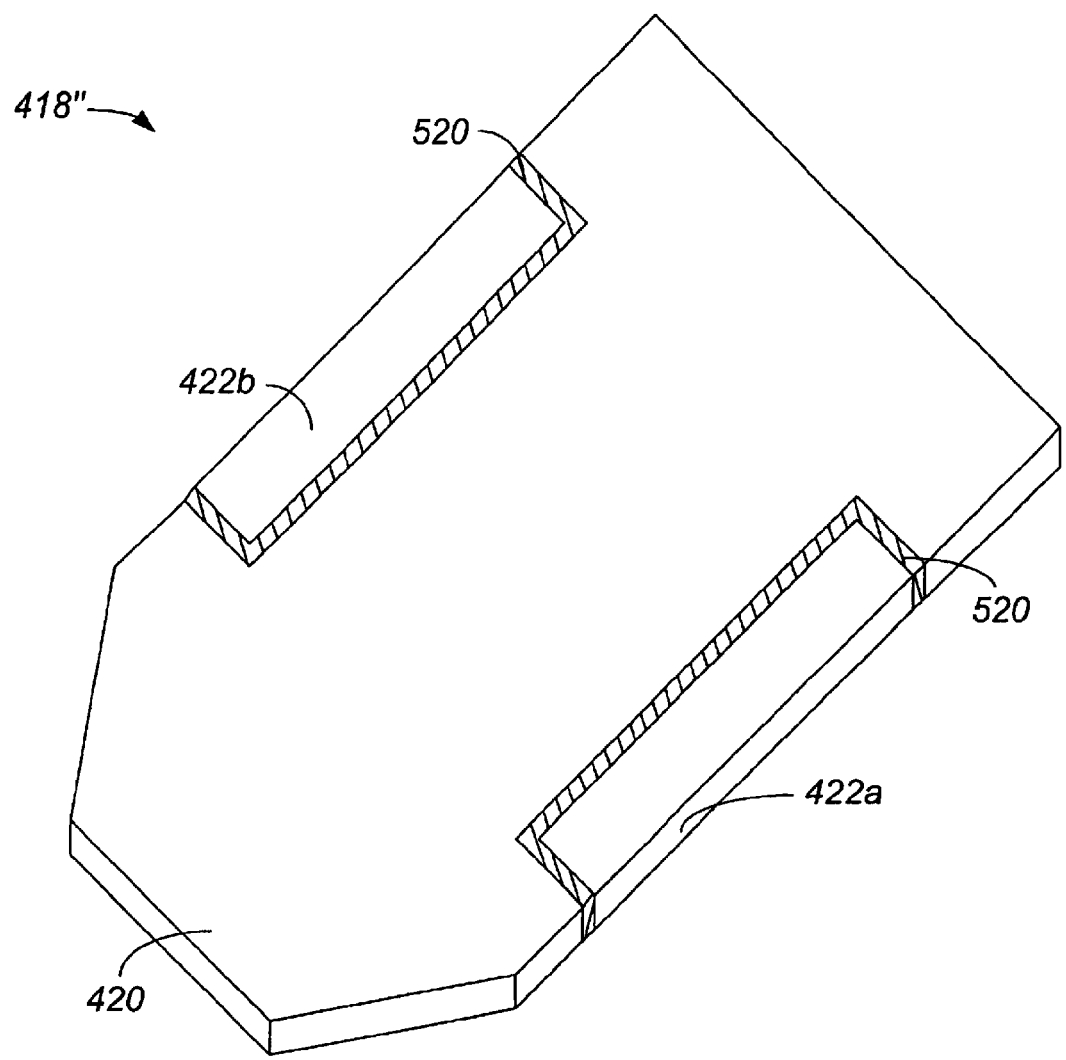
FIG. 5b is a diagrammatic representation of a caster system, i.e., caster system 418 of FIG. 4, which includes filler material in accordance with an embodiment of the present invention.

FIG. 5b is a diagrammatic representation of a caster system, i.e., caster system 418 of FIG. 4, which includes filler material in accordance with an embodiment of the present invention. Within caster system 418", AVIS support section 420 and reaction frame support sections 422 are physically coupled by a filler material 520. Filler material 520, which may be substantially any material which does not transmit significant forces or vibrations therethrough, may be bonded to AVIS support section 420 and reaction frame support sections 422 using a bonding material such as an adhesive material.

As filler material 520 effectively secures or otherwise connects AVIS support section 420 to reaction frame support sections 422, caster system 418" is effectively a single physical piece which has decoupled sections with regards to the transmission of forces or vibrations. In other words, caster system 418" is essentially formed as a cohesive or unified member that includes AVIS support section 420 and reaction frame support sections 422 which are arranged such that forces or vibrations in reaction frame support sections 422 are substantially isolated from AVIS support section 420.

The use of filler material 520 which is bonded between AVIS support section 420 and reaction frame support sections 422 enables caster system 418" to be moved as a single piece, while still functioning to isolate forces and vibrations associated with reaction frame support section 422. Using filler material 520 substantially eliminates the need to attach brackets such as brackets 502 of FIG. 5a in order to move caster system 418", and to detach the brackets once caster system 418" is in position.

Since filler material 520 is generally a weak or soft material such as soft rubber, filler material 520 may have some flexibility. In other words, filler material 520 may slightly compress or slightly extend. As such, in the event that reaction forces associated with a reaction frame positioned on reaction frame support sections 422 cause reaction frame support sections 422 to move slightly, filler material 520 may slightly compress or slightly extend, and effectively prevent AVIS support section 420 from moving.

As described above, a photolithography system according to the above-described embodiments, e.g., a photolithography apparatus which may be positioned on an isolated caster system, may be built by assembling various subsystems in such a manner that prescribed mechanical accuracy, electrical accuracy, and optical accuracy are maintained. In order to maintain the various accuracies, prior to and following assembly, substantially every optical system may be adjusted to achieve its optical accuracy. Similarly, substantially every mechanical system and substantially every electrical system may be adjusted to achieve their respective desired mechanical and electrical accuracies. The process of assembling each subsystem into a photolithography system includes, but is not limited to, developing mechanical interfaces, electrical circuit wiring connections, and air pressure plumbing connections between each subsystem. There is also a process where each subsystem is assembled prior to assembling a photolithography system from the various subsystems. Once a photolithography system is assembled using the various subsystems, an overall adjustment is generally performed to ensure that substantially every desired accuracy is maintained within the overall photolithography system. Additionally, it may be desirable to manufacture an exposure system in a clean room where the temperature and humidity are controlled.

Figure 6:
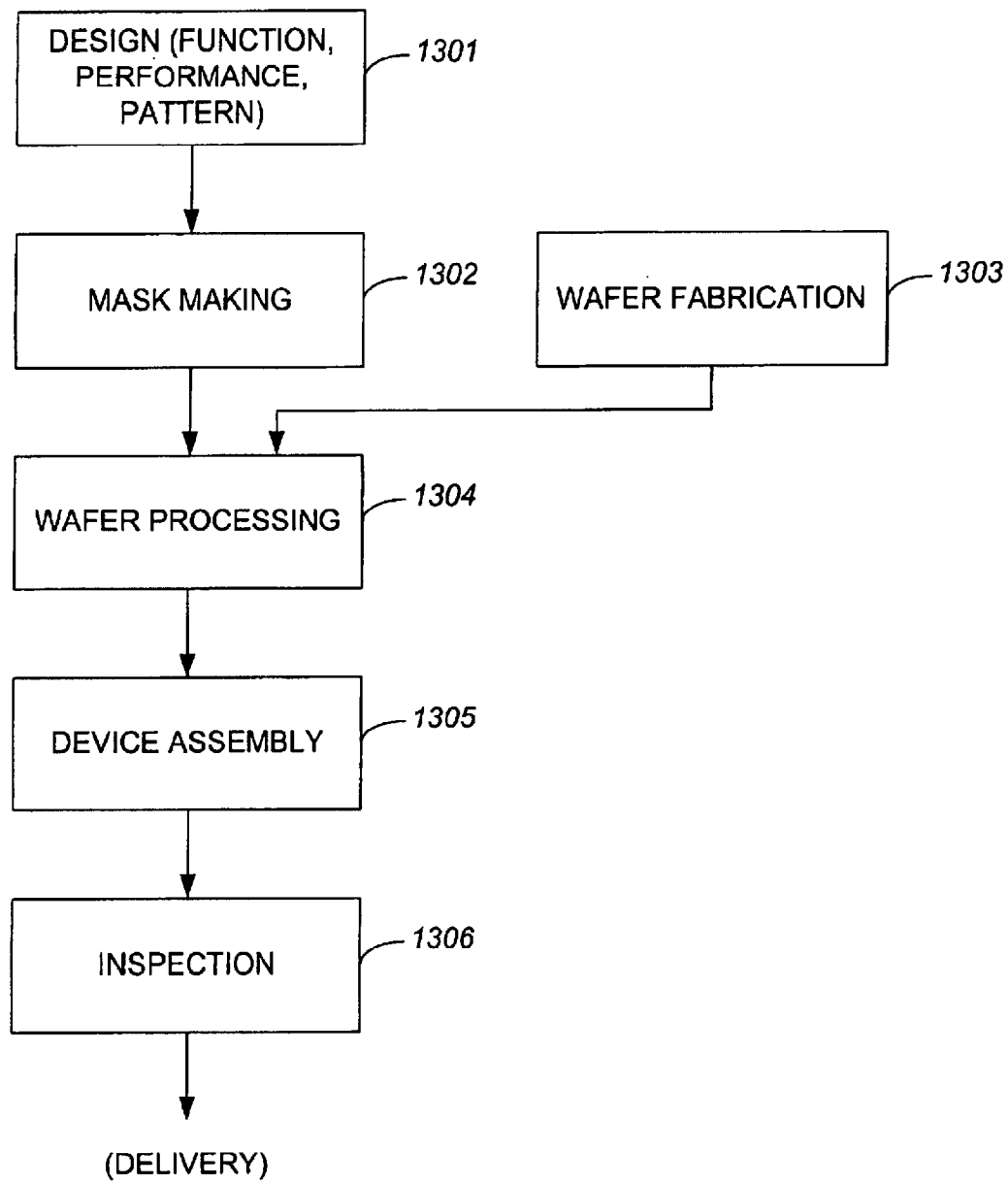
FIG. 6 is a process flow diagram which illustrates the steps associated with fabricating a semiconductor device in accordance with an embodiment of the present invention.

Further, semiconductor devices may be fabricated using systems described above, as will be discussed with reference to FIG. 6. The process begins at step 1301 in which the function and performance characteristics of a semiconductor device are designed or otherwise determined. Next, in step 1302, a reticle (mask) in which has a pattern is designed based upon the design of the semiconductor device. It should be appreciated that in a parallel step 1303, a wafer is made from a silicon material. The mask pattern designed in step 1302 is exposed onto the wafer fabricated in step 1303 in step 1304 by a photolithography system. One process of exposing a mask pattern onto a wafer will be described below with respect to FIG. 7. In step 1305, the semiconductor device is assembled. The assembly of the semiconductor device generally includes, but is not limited to, wafer dicing processes, bonding processes, and packaging processes. Finally, the completed device is inspected in step 1306.

Figure 7:
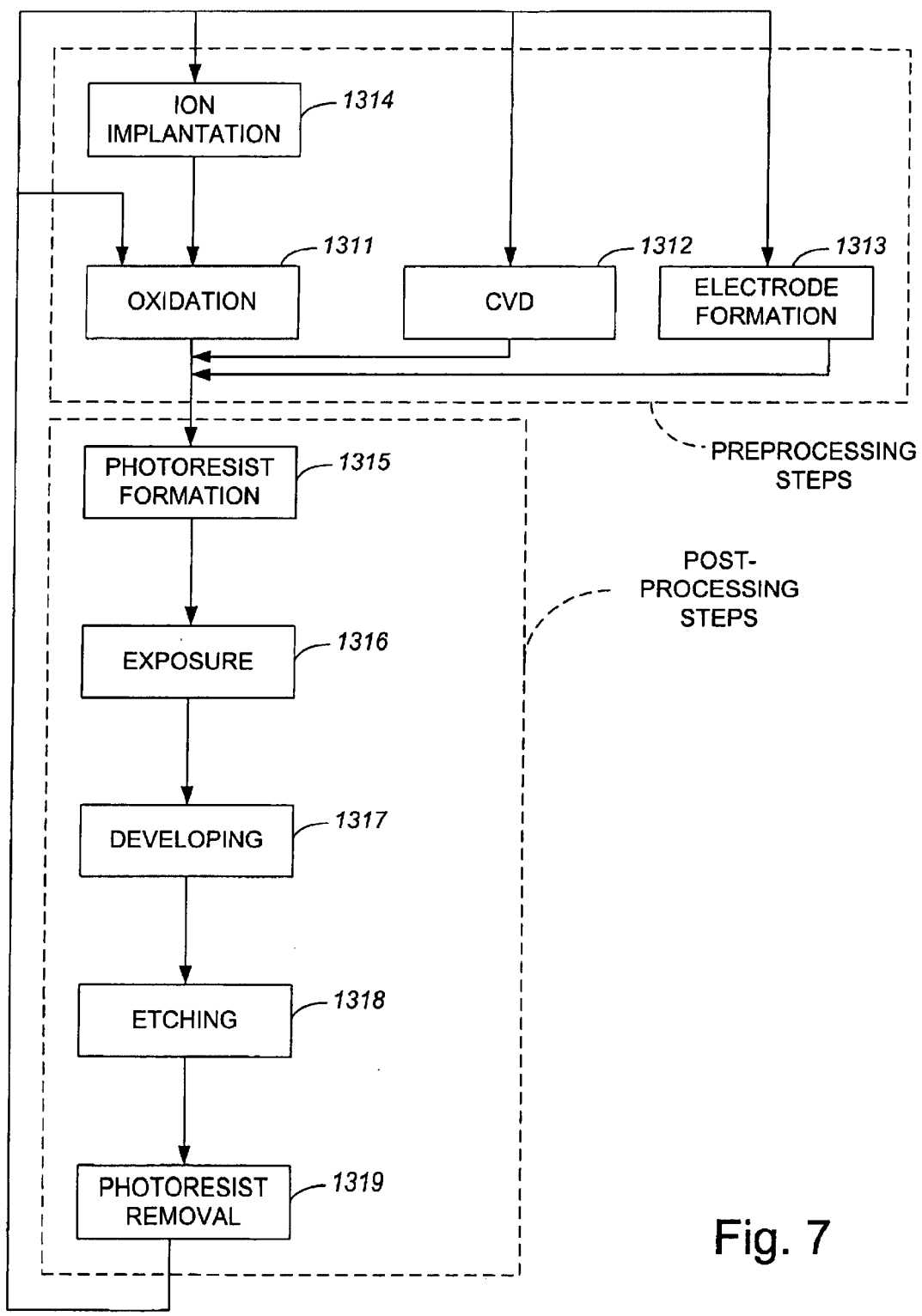
FIG. 7 is a process flow diagram which illustrates the steps associated with processing a wafer, i.e., step 1304 of FIG. 6, in accordance with an embodiment of the present invention.

FIG. 7 is a process flow diagram which illustrates the steps associated with wafer processing in the case of fabricating semiconductor devices in accordance with an embodiment of the present invention. In step 1311, the surface of a wafer is oxidized. Then, in step 1312 which is a chemical vapor deposition (CVD) step, an insulation film may be formed on the wafer surface. Once the insulation film is formed, in step 313, electrodes are formed on the wafer by vapor deposition. Then, ions may be implanted in the wafer using substantially any suitable method in step 1314. As will be appreciated by those skilled in the art, steps 1311–1314 are generally considered to be preprocessing steps for wafers during wafer processing. Further, it should be understood that selections made in each step, e.g., the concentration of various chemicals to use in forming an insulation film in step 1312, may be made based upon processing requirements.

At each stage of wafer processing, when preprocessing steps have been completed, post-processing steps may be implemented. During post-processing, initially, in step 1315, photoresist is applied to a wafer. Then, in step 1316, an exposure device may be used to transfer the circuit pattern of a reticle to a wafer. Transferring the circuit pattern of the reticle to the wafer generally includes scanning a reticle scanning stage which may, in one embodiment, include a force damper to dampen vibrations.

After the circuit pattern on a reticle is transferred to a wafer, the exposed wafer is developed in step 1317. Once the exposed wafer is developed, parts other than residual photoresist, e.g., the exposed material surface, may be removed by etching. Finally, in step 1319, any unnecessary photoresist that remains after etching may be removed. As will be appreciated by those skilled in the art, multiple circuit patterns may be formed through the repetition of the preprocessing and post-processing steps.

Although only a few embodiments of the present invention have been described, it should be understood that the present invention may be embodied in many other specific forms without departing from the spirit or the scope of the present invention. By way of example, a caster system has been described as including three substantially separated pieces. That is, a caster system has generally been described as either including three individual, uncoupled pieces, or three individual pieces which are loosely coupled using a relatively weak material such as soft rubber. It should be appreciated, however, that a caster system which allows a frame caster associated with a reaction frame to be substantially separated from a caster associated with an AVIS may be formed from any number of components, e.g., a single frame caster which supports the reaction frame may be used instead of two frame casters which support the reaction frame.

In general, substantially any suitable mechanism may be used to couple components of caster system together to enhance the portability of an apparatus which is situated on or includes the caster system. While brackets and adhesives are suitable for holding sections of a caster system together, other suitable mechanisms may include, but are not limited to, any combination of screws, nuts, bolts, vises, and clamps.

While the use of a caster system which includes a frame caster associated with a reaction frame to be coupled to a caster associated with an AVIS enables the caster system and an apparatus secured thereon to be relatively easily moved, such a caster system may facilitate the movement of the caster alone. For example, coupling the individual casters of the caster system may also facilitate a process of shipping the caster system alone.

Mechanisms used to secure or otherwise attach a reaction frame or other portions of a photolithography or exposure apparatus to an isolated caster system may be widely varied. By way of example, substantially any suitable mechanism or means may be used to attach an AVIS or a reaction frame to an isolated caster system. Suitable mechanism may include, but are not limited to, various mechanical couplers.

The materials used to form an isolated caster system have been described as either being granite or polymer. In general, substantially any suitable material may be used in the formation of an isolated caster system. Suitable materials may vary depending upon the requirements of a specific isolated caster system. By way of example, other suitable materials may include, but are not limited to, cast iron, welded steel, and aluminum. Additionally, a frame caster and a caster included in a given isolated caster system may be formed from different materials, i.e., the components of a given isolated caster system are not necessarily formed form the same material.

Further, although a material such as a soft rubber may be used to physically couple or connect a frame caster to a caster within an isolated caster system, it should be understood that substantially any relatively weak material may be used for coupling purposes. Typically, any material which allows a frame caster and a caster within an isolated caster system to be physically coupled while substantially preventing vibratory modes from being transmitted through the material may be suitable.

An isolated caster system has been described as being suitable for use with an apparatus that includes an AVIS. It should be appreciated, however, that an isolated caster system may be used with respect to an apparatus that does not include an AVIS without departing from the spirit or the scope of the present invention. For instance, rather than mounting an AVIS to a caster in the isolated caster system, separate isolators which are not part of an AVIS or other components of an apparatus may instead be mounted substantially directly to the caster. In other words, in lieu of an AVIS, other types of isolation systems may be used within an apparatus and, hence, mounted on an isolated caster system, or no isolation system may be used. Therefore, the present examples are to be considered as illustrative and not restrictive, and the invention is not to be limited to the details given herein, but may be modified within the scope of the appended claims.

What is claimed is:

1. A caster system, the caster system being arranged to support portions of a stage apparatus thereon, the stage apparatus including a reaction frame and a stage assembly, the reaction frame being arranged to absorb reaction forces associated with the stage assembly, the caster system comprising:
   a first caster component arranged to support the stage assembly; and
   a second caster component arranged to support the reaction frame, wherein the second caster component is vibrationally separated from the first caster component and is not arranged as a part of the reaction frame.

2. A caster system, the caster system being arranged to support portions of a stage apparatus thereon, the stage apparatus including a reaction frame and a stage assembly, the reaction frame being arranged to absorb reaction forces associated with the stage assembly, the caster system comprising:
   a first caster component arranged to support the stage assembly; and
   a second caster component arranged to support the reaction frame, wherein the second caster component is vibrationally separated from the first caster component and is arranged to be physically coupled to the first caster component to enable the first caster component, the second caster component, the reaction frame, and the stage assembly to be moved as a substantially single unit.

3. The caster system of claim 2 wherein the stage apparatus further includes a vibration isolation system, the vibration isolation system being arranged to support the stage assembly, the vibration isolation system further being arranged to be coupled to the first caster component.

4. The caster system of claim 2 wherein the first caster component and the second caster component are arranged to be physically separated when the stage apparatus is not being moved.

5. The caster system of claim 2 wherein the second caster component and the first caster component are arranged to be physically coupled using at least one bracket mechanism to enable the first caster component, the second caster component, the reaction frame, and the stage assembly to be moved as a substantially single unit.

6. The caster system of claim 2 wherein the second caster component and the first caster component are arranged to be physically coupled using a first material to enable the first caster component, the second caster component, the reaction frame, and the stage assembly to be moved as a substantially single unit, the first material being arranged to substantially absorb vibrations.

7. The caster system of claim 6 wherein the first material is arranged to prevent at least some vibrations associated with the second caster component from being transmitted to the first caster component.

8. The caster system of claim 6 wherein the first material is a rubber material.

9. The caster system of claim 2 wherein the first caster component and the second caster component are formed from one of a granite material and a polymer material.

10. The caster system of claim 2 wherein the stage apparatus is an exposure apparatus.

11. A caster system, the caster system being arranged to support portions of a stage apparatus thereon, the stage apparatus including a reaction frame and a stage assembly, the reaction frame being arranged to absorb reaction forces associated with the stage assembly, the caster system further being arranged to facilitate movement of the stage apparatus supported thereon, the caster system comprising:
   a first component, the first component being arranged to be coupled to the stage assembly; and
   a second component, the second component being arranged to be coupled to the reaction frame, the second component further being arranged to be vibrationally isolated from the first component to prevent at least one vibrational mode associated with the reaction frame from causing an affect in the first component, wherein the second component is not arranged to be part of the reaction frame.

12. A caster system, the caster system being arranged to support portions of a stage apparatus thereon, the stage apparatus including a reaction frame and a stage assembly, the reaction frame being arranged to absorb reaction forces associated with the stage assembly, the caster system further being arranged to facilitate movement of the stage apparatus supported thereon, the caster system comprising:
   a first component, the first component being arranged to be coupled to the stage assembly; and
   a second component, the second component being arranged to be coupled to the reaction frame, the second component further being arranged to be vibrationally isolated from the first component to prevent at least one vibrational mode associated with the reaction frame from causing an affect in the first component, wherein the first component and the second component are further arranged to be physically coupleable to facilitate the movement of the stage apparatus.

13. The caster system of claim 12 wherein the stage apparatus further includes a vibration isolation system, the vibration isolation system being arranged to support the stage assembly, the vibration isolation system further being arranged to be coupled to the first component.

14. The caster system of claim 13 wherein the vibration isolation system is an active vibration isolation system.

15. The caster system of claim 12 wherein the first component and the second component are arranged to be physically decoupled when the stage apparatus is not being moved.

16. The caster system of claim 12 wherein the second component and the first component are arranged to be physically coupled using at least one bracket mechanism to enable the first component, the second component, the reaction frame, and the stage assembly to be moved as a substantially single unit.

17. The caster system of claim 12 wherein the second component and the first component are arranged to be physically coupled using a first material to enable the first component, the second component, the reaction frame, and the stage assembly to be moved as a substantially single unit, the first material being arranged to substantially absorb vibrations.

18. The caster system of claim 17 wherein the first material is arranged to prevent at least some vibrations associated with the second component from being transmitted to the first component.

19. The caster system of claim 12 wherein the stage apparatus is an exposure apparatus.

20. An apparatus comprising:
   a stage assembly, the stage assembly including a motor and a table, the motor being arranged to cause the table to move, wherein when the motor causes the table to move, the motor generates a reaction force;
   a reaction frame, the reaction frame being coupled to the stage assembly, wherein the reaction force is arranged to be transmitted from the motor to the reaction frame; and
   a caster system, the caster system including a first caster component that is arranged to support the stage assembly and a second caster component that is arranged to support the reaction frame, the caster system being arranged to facilitate moving the stage assembly and the reaction frame as a substantially single unit, wherein the second caster component is arranged to be physically coupled to the first caster component and the second caster component is vibrationally isolated from the first caster component.

21. The apparatus of claim 20 further including a vibration isolation system, wherein the stage assembly is arranged to be positioned over the vibration isolation system and the vibration isolation system is arranged to be supported by the first caster component.

22. The apparatus of claim 21 wherein the vibration isolation system is an active vibration isolation system.

23. An exposure apparatus comprising the apparatus of claim 20.

24. A device manufactured with the exposure apparatus of claim 23.

25. A wafer on which an image has been formed by the exposure apparatus of claim 23.

26. A method for positioning a stage apparatus, the stage apparatus including a reaction frame and a stage assembly, the method comprising:
   arranging a first caster component and a second caster component in a first orientation, the first caster component being arranged to support the stage assembly and the second caster component being arranged to support the reaction frame;
   moving the stage apparatus; and
   arranging the first caster component and the second caster component in a second orientation, wherein the second caster component is vibrationally separated from the first caster component in the second orientation.

27. The method of claim 26 wherein arranging the first caster component and the second caster component in the first orientation includes physically coupling the first caster component and the second caster component to substantially enable the first caster component, the second caster component, the reaction frame, and the stage assembly to be moved as a substantially single unit.

28. The caster system of claim 27 wherein arranging the first caster component and the second caster component in the second orientation includes physically decoupling the first caster component and the second caster component after moving the stage apparatus.

* * * * *